United States Patent [19]
Morrison

[11] Patent Number: 5,556,795
[45] Date of Patent: Sep. 17, 1996

[54] QUANTUM WELL SUPERLUMINESCENT DIODE

[75] Inventor: Charles B. Morrison, Brewster, N.Y.

[73] Assignee: International Business Machines Corporation, Armonk, N.Y.

[21] Appl. No.: 202,146

[22] Filed: Feb. 25, 1994

Related U.S. Application Data

[63] Continuation of Ser. No. 819,548, Jan. 10, 1992, Pat. No. 5,329,134.

[51] Int. Cl.$^6$ .................................................. H01L 21/265
[52] U.S. Cl. ........................... 437/23; 437/126; 437/127; 437/129; 437/904
[58] Field of Search ............................. 437/23, 126, 127, 437/129, 904, 905; 257/94, 95, 96, 14

[56] References Cited

U.S. PATENT DOCUMENTS

| | | |
|---|---|---|
| 4,634,928 | 1/1987 | Figueroa et al. . |
| 4,730,331 | 3/1988 | Burnham et al. . |
| 4,764,934 | 8/1988 | Kwong et al. . |
| 4,787,089 | 11/1988 | Hayakawa et al. . |
| 4,789,881 | 12/1988 | Alphonse . |
| 4,821,276 | 4/1989 | Alphonse et al. . |
| 4,821,277 | 4/1989 | Alphonse et al. . |
| 4,841,533 | 6/1989 | Hayakawa et al. . |
| 4,843,032 | 6/1989 | Tokuda et al. . |
| 4,845,724 | 7/1989 | Hayakawa et al. . |
| 4,856,014 | 8/1989 | Figuero et al. . |
| 4,888,784 | 12/1989 | Hirata . |
| 4,896,195 | 1/1990 | Jasen et al. . |
| 4,901,123 | 2/1990 | Noguchi et al. . |
| 4,905,246 | 2/1990 | Hayakawa et al. . |
| 4,916,708 | 4/1990 | Hayakawa . |
| 4,952,019 | 8/1990 | Evans et al. . |
| 5,008,889 | 4/1991 | Wilson . |
| 5,022,036 | 6/1991 | Suyama et al. . |
| 5,036,371 | 7/1991 | Schwartz ...................... 257/14 |
| 5,040,032 | 8/1991 | Kapon ........................... 257/14 |
| 5,126,803 | 6/1992 | Hager et al. . |

FOREIGN PATENT DOCUMENTS

| | | |
|---|---|---|
| 0318947 | 11/1988 | European Pat. Off. . |
| 59-141282 | 8/1984 | Japan . |
| 1117073 | 5/1989 | Japan . |
| 2152292 | 6/1990 | Japan . |
| 2205365 | 8/1990 | Japan . |
| 355887 | 3/1991 | Japan . |

OTHER PUBLICATIONS

"High–power low divergence superradiance diode"; C. W. Wang; APL 41(7); Oct. 1982, pp. 587–589.
"A graded–index waveguide separate–confinement laser with very low threshold and a narrow Gaussian beam"; W. T. Tsang; APL 39(2), Jul. 15, 1981; pp. 134–136.
"High–Power Superluminescent Diodes"; Gerard A. Alphonse et al.; 1988 IEEE, vol. 24, No. 12, Dec. 1988; pp. 2454–2457.
"Quantum–Well Heterostructure Lasers"; Nick Holonyak, Jr., et al.; IEEE Journal Vol. QE–16, No. 2; Feb. 1980; pp. 170–184.
"High–Power Ridge–Waveguide AlGaAs GRIN–SCH Laser Diodes"; C. Harder et al.; Electronics Letters, vol. 22, No. 20; Sep. 1988; pp. 1081–1082.
"Ultralow–threshold graded–index separate–confinement single quantum well buried heterostructure (Al,Ga) As lasers with high reflectivity coatings"; Pamela L. Derry et al.; APL 50(25); 22 Jun. 1987; pp. 1773–1775.
"Scaling laws and minimum threshold currents for quantum–confined semiconductor lasers"; Amnon Yariv; APL 53(12); Sep. 1988; pp. 1033–1035.

*Primary Examiner*—Kevin M. Picardat
*Attorney, Agent, or Firm*—Whitham, Curtis, Whitham & McGimm; Eric W. Petraske

[57] ABSTRACT

A quantum well is formed in the active region of a superluminescent diode by limiting the active region to a thickness on the order of the carrier deBroglie wavelength. Increased efficiency of recombination of electrons and holes due to the existence of the quantum well allows operation at threshold currents which are substantially proportional to cavity length. Variation in threshold current with temperature is also reduced.

17 Claims, 2 Drawing Sheets

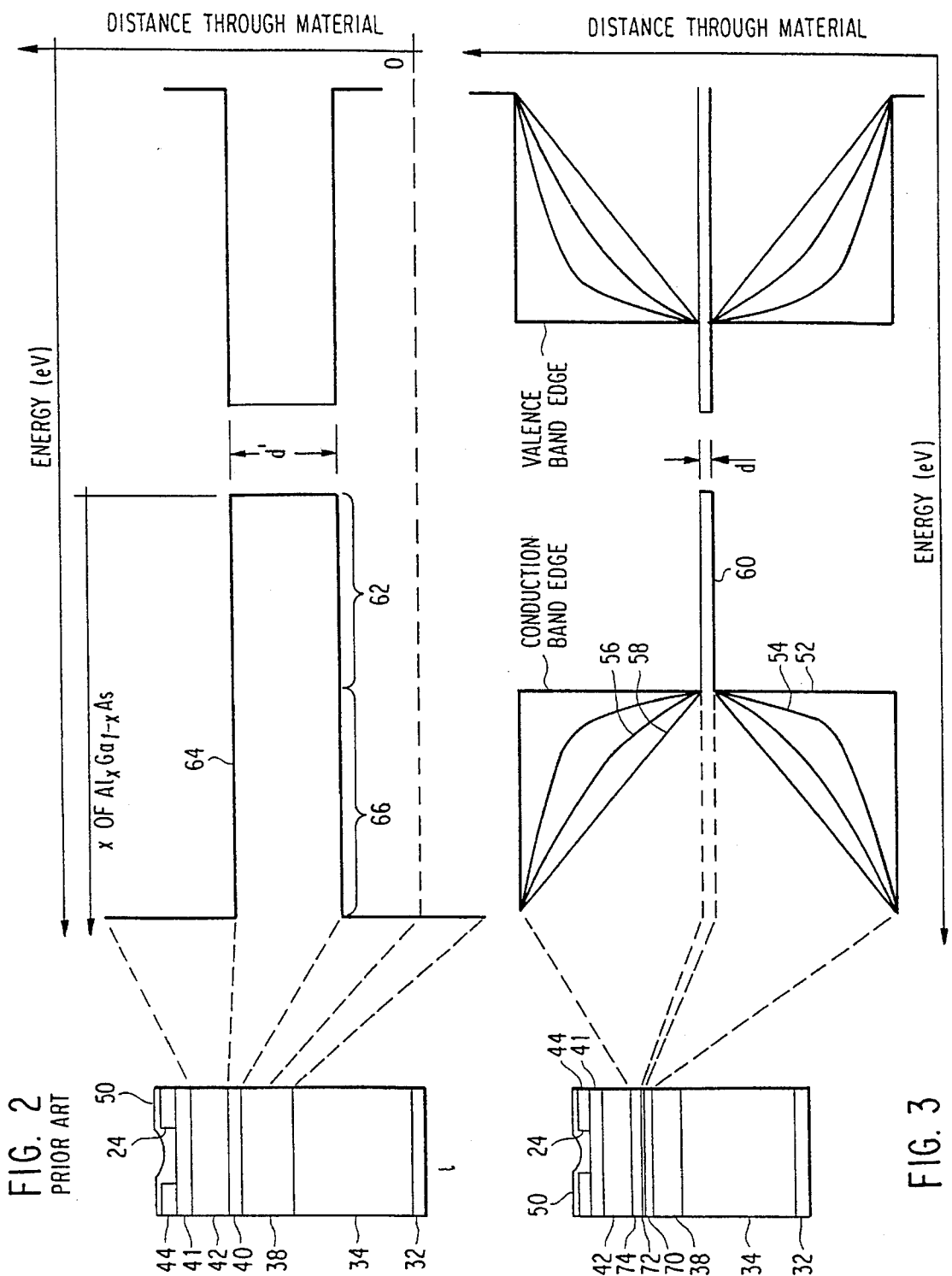

QUANTUM WELL SUPERLUMINESCENT DIODE

This is a continuation of application Ser. No. 07/819,548, filed Jan. 10, 1992 now U.S. Pat. No. 5,329,134.

BACKGROUND OF THE INVENTION

1. Field of the Invention

The present invention generally relates to light-emitting semiconductor devices and, more particularly, to superluminescent diodes.

2. Description of the Prior Art

Numerous semiconductor devices capable of light-emission have become known in recent years. Among these devices are the light-emitting diode (LED) and the semiconductor laser. LED's function by injecting holes and electrons into an active region at a junction of the diode. Light emission is then caused by the spontaneous recombination of electrons and holes. This radiative recombination is made to predominate over other equilibrium recombinations by the development of a potential barrier (i.e. bandgap, as distinct from a potential barrier of a p-n junction) which limits a majority of electron energies at the junction to levels at which radiative emission will occur.

Since the recombination is spontaneous and all electrons and holes must be injected as a current applied to the LED, efficiency is low. Spectral purity is also low due to the plurality of energy states at which recombination may take place.

In contrast, semiconductor lasers have much higher efficiency due to gain attributable to photons emitted from a recombination of an electron-hole pair which stimulate radiative recombination of other electron-hole pairs and thus stimulate emission of radiation in a common wavefront of uniform phase, thereby creating a coherent beam of light. These effects are enhanced by containment of light within a resonant cavity.

The light produced by a semiconductor laser is not only coherent but also of high spectral purity. Because of these qualities of light and the high efficiency typical of lasers due to the stimulated recombination of electron-hole pairs, engendering gain, many applications have been developed in which lasers can be advantageously used. Since the light output from lasers can be modulated at very high frequencies, lasers have been applied to communication systems, often in combination with fiber optics.

Lasers have also been used in combination with fiber optics in so-called fiber optic gyroscopes which have recently been widely used in high accuracy guidance and navigation systems. However, some difficulties have been encountered by noise generated by Rayleigh backscattering in the fiber, which causes optical feedback to the laser. This feedback affects the laser gain and, therefore, the amplitude of light output of the laser, engendering noise and reducing the accuracy of the gyroscope. Laser performance under conditions of external optical feedback is also complicated by Fabry-Perot modulation of the light wavelength. Fabry-Perot modulation is due to alteration of the index of refraction within the laser and, therefore, the effective length of the resonant cavity, with changes in light intensity.

Similar problems occur but with even greater severity in fiber-optic communication systems because the length of the fiber-optic light guides is far greater and the light path will also include interconnection and coupling surfaces which are inherently partially reflective. In fact, feedback of light to the laser from reflections in the fiber-optic system often predominates over Rayleigh backscattering as a cause of noise in the system.

Fabry-Perot modulation can be reduced by reduction of light intensity within the resonant cavity of the laser. Since the laser inherently operates by developing high light intensity in a resonant cavity, however, reduction of light intensity in the resonant cavity is inconsistent with laser operation. Nevertheless, stimulated emission of light with gain can occur at lower light intensity and reduction in the coherence length of the emitted light. This can be done in several ways already known in the art.

A first method of reducing coherence length and broadening of the spectral bandwidth of the laser is to tilt the waveguide or resonant cavity of known double-heterostructure lasers at a slight angle to reduce the internal reflectivity of the resonant cavity. A second method is to rely on coatings at the ends of the resonant cavity to decrease reflectivity as in Burnham et al., U.S. Pat. No. 4,730,331 or to provide a light absorption portion of the waveguide as disclosed in Noguchi et al., EPO 0 318 947 or Kwong et al., U.S. Pat. No. 4,764,934. Both of these approaches allow virtually all the light within the resonant cavity to escape and thus reduces the stimulation of electron-hole radiative recombination by the reflected photons. These approaches result in reduction of the coherence length of the emitted light. Providing for escape of a sufficient amount of light to prevent the lasing action is not trivial since gain will occur due to a single pass of photons through the body of the material (i.e. the cavity) and containment of only about 1% of the light produced is necessary to support a lasing action. The reduction of internally reflected light reduces light intensity within the cavity and greatly reduces Fabry-Perot modulation. Some of the device gain is lost but efficiency is still far higher than that of LED's since stimulated recombination continues to occur with achievement of net gain during the single pass of photons through the material.

All of these methods of broadening the spectral output effectively reduce the coherence length of the emitted light. In essence, these effects cause the laser to operate more like an LED (that is, for the LED, no Fabry-Perot modulation, broad spectrum, very-low intensity spontaneously emitted, non-coherent light output) by reducing optical feedback amplification while still providing a much increased efficiency and light output capacity. Net gain is maintained in these devices through stimulated emission (i.e. stimulated radiative recombination of electron-hole pairs). Substantial efficiency may be maintained even when the resonant modes of the cavity are entirely suppressed since gain remains available from the single pass stimulated recombination of electrons and holes. Such laser-like structures operating at short coherence lengths are generally referred to as superluminescent or superradiance diodes. A more detailed description of such devices, and a solution to the problem of noise due to Rayleigh backscattering can be found in *High-power Low-divergence Superradiance Diode* by Wang et al.; Applied Physics Letters 41(7), October, 1982; pp.587–589 and *High-Power Superluminescent Diodes* by Alphonse et al.; IEEE Journal of Quantum Electronics, Vol. 24, No. 12: December, 1988; pp. 2454–2457, both of which are hereby incorporated by reference.

To date, while many different structures have been used in semiconductor lasers, the most widely used electronic structure is known as a double-heterojunction. (While the term double-heterojunction is more properly used to refer to the electronic properties of a semiconductor structure known by the term double-heterostructure (which, properly used, refers to the metallurgical structure), these terms are sometimes used interchangeably.) Virtually all superluminescent diodes based upon laser structures are modifications of the double-heterojunction laser configuration described in the above incorporated publications. Waveguides of semiconductor lasers fall into two types; gain guided, where the cavity boundary is formed at the boundary of the pumped region (causing the geometry of such configuration to vary significantly with temperature) and index guided, using a change in index of refraction to form the boundary of the cavity or waveguide to contain the light at less than a critical angle to the axis of the cavity.

Examples of fabrication of SLDs from these types of double-heterojunction laser are taught in U.S. Pat. No. 4,789,881 to Alphonse, which relies on an external cavity for operation; U.S. Pat. No. 4,821,276 to Alphonse et al., which relies on crystal cleaving or etching to achieve the equivalent of an inclined stripe, used to obtain off-axis reflection; U.S. Pat. No. 4,821,277 to Alphonse et al., which includes a gain-guided waveguide; and U.S. Pat. No. 4,856,014 to Figueroa et al. (including the present inventor) which uses an index-guided waveguide structure, all of which are also hereby incorporated by reference.

For reasons of convenience in the manufacture of superluminescent diodes (SLD), it has been the practice in SLD design to alter double-heterojunction semiconductor lasers by modifying the laser stripe defining the waveguide orientation so that the cavity is inclined at a slight angle to a direction perpendicular to the facet mirrors of at least one-half of the critical angle above which total internal reflection does not occur in the channel waveguide or about 5°, in most cases, but possibly as low as 3°. This condition will also be met whenever there is no line perpendicular to an end facet and intersecting that end facet that intersects the opposite end facet. Additional design criteria for the method of inclination of the waveguide to the facets is described in Alphonse et al, U.S. Pat. No. 4,821,277, and Figueroa et al, U.S. Pat. No. 4,856,014, both incorporated by reference above. However, several problems occur when this or other approaches to forming SLDs from laser structures are done.

Known SLDs designed in any manner characteristically have very high threshold currents, generally two to three times the threshold current required to produce laser operation in comparable laser designs. The increase in threshold current is due almost entirely to the lack of positive feedback of the photon containment. This level of threshold current requires complicated cooling arrangements and power supplies for operation of the SLD in comparison with the power supplies and cooling arrangements required for lasers of comparable design. This threshold current is also very temperature sensitive, complicating necessary drive circuitry and reducing reliability and useful lifetime of the superluminescent diode. The temperature sensitivity also complicates the design and operation of cooling arrangements if consistent operation is to be obtained. The differential quantum efficiency is also generally reduced in comparison with similar laser designs.

Another electronic structure used in semiconductor lasers is the quantum-well heterojunction. This configuration differs from the double-heterojunction laser configuration principally in the thickness of the active region bounded by the two highly doped confining layers typical of the double-heterojunction. When this active layer is reduced to the order of the de Broglie wavelength, effects are encountered which are not typical of the bulk material. A detailed discussion of the structure, method of manufacture and theory of operation of quantum well lasers is provided in *Quantum-Well Heterostructure Lasers*, by Nick Holonyak, Jr.; IEEE Journal of Quantum Electronics, Vol.QE-16, No. 2: February, 1980; pp. 170–186, which is also fully incorporated by reference. A quantum well semiconductor laser is also disclosed in Hayakawa et al., U.S. Pat. No. 4,841,533. In essence, the quantum well is formed by the thinness of the active region which causes the density of states of electrons in the active region to become quantized and confined to a finite potential well. The usual band-to-band recombination process is therefore modified in a fundamental manner.

As taught at page 171 of the Holonyak article, in a double-heterojunction where the density of states is not quantized, the electrons and holes can recombine at any of a continuum of energies and the density of states varies parabolically with energy. Therefore, electrons and holes cannot all be of fixed energies or recombine in a narrow line width or wavelength. However, in a quantum well laser, electrons thermalize by photon generation to quantized states and the electrons confined in the quantum well are, in principle, of a single, fixed energy state. These confined electrons are confined with holes which are also at a fixed energy which enhances recombination with electrons. Moreover, the thermalization of electrons is not limited by the decreasing density of states characteristic of the double-heterojunction lasers and thermalization is more efficient, allowing electrons and holes to be moved into the active region at energies below that of the confined particles. This yields a significantly lower threshold for laser operation in comparison with the double-heterostructure configuration. In addition, temperature sensitivity of threshold current is somewhat reduced, relative to double-heterojunction lasers.

While the quantum well configuration for semiconductor lasers has been known for a number of years, the formation of SLD's based on laser designs is a relatively recent development and, as indicated above, has been confined to modification of double-heterojunction lasers. The feasibility of forming SLD's based on quantum well laser designs or otherwise providing quantum well structures in SLD devices has not, heretofore, been investigated.

SUMMARY OF THE INVENTION

It is therefore an object of the present invention to provide an SLD device including a quantum well structure.

It is another object of the invention to provide an SLD device based upon a quantum well laser configuration.

It is a further object of the invention to provide an SLD device having a reduced current threshold and a reduced temperature sensitivity of that threshold.

It is another further object of the invention to provide a design method for a superluminescent diode in which a threshold current may be readily determined.

In order to achieve the above and other objects of the invention, a superluminescent semiconductor diode is provided having an active region including a quantum well.

In accordance with another aspect of the invention, a superluminescent semiconductor diode is provided including an active region between two semiconductor cladding layers and a waveguide having an axis and termination means for limiting internal reflection at ends of said waveguide, the active region having a thickness on the order of a carrier deBroglie wavelength.

In accordance with a further aspect of the invention, a method of making a superluminescent diode is provided including the steps of forming a first cladding layer, forming a quantum well in an active region formed on the first cladding layer, and forming a second cladding layer over the active region.

In accordance with another further object of the invention, a method of establishing a current threshold of a superluminescent diode having an active region including a quantum well comprising the step of establishing a length of a cavity of said superluminescent diode.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is a cross-sectional view of a preferred embodiment of the invention including an expanded diagram of a preferred band-gap energy profile thereof.

DETAILED DESCRIPTION OF A PREFERRED EMBODIMENT OF THE INVENTION

The fact that the efficiency of stimulated recombination of electrons and holes is much increased in quantum well lasers serves to produce a lower threshold current. However, this property of quantum well lasers, together with the fact that gain occurs due to a single pass of photons through the material, also suggests that suppression of the lasing action, by which Fabry-Perot modulation is limited, may be more difficult than for bulk double-heterostructure designs. Further, while the current threshold of quantum well lasers is known to be reduced in comparison with double-heterostructure lasers, the nature of a relative reduction of threshold current, if any, in a quantum well SLD has not heretofore been investigated, either experimentally or analytically. Neither has an SLD including a quantum well been designed or fabricated prior to the present invention.

Figure 1A:
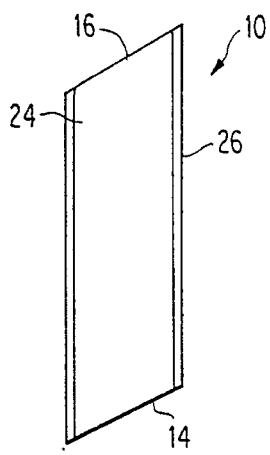
FIG. 1a is an illustration of a preferred embodiment of the cavity of invention.
Figure 1B:
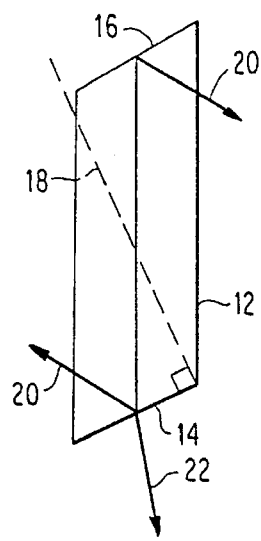
FIG. 1b is a diagram of important features of the geometry of the cavity Illustrated in FIG. 1a, FIG. 2 is a cross-sectional view of a known double-heterojunction.

Referring now to the drawings, and more particularly to FIG. 1a, the basic form of the superluminescent diode waveguide according to the invention is shown. The overall shape of the superluminescent diode (SLD) 10 is not particularly critical to the invention. Due to the desirability of forming facet mirrors by cleaving of the chip, the waveguide is generally placed at an angle to the crystal lattice of the chip since the waveguide structure can be formed accurately regardless of the orientation of the crystal lattice. However, the important feature is the relative angular positioning of the waveguide axis and the facet mirrors and, for purposes of clarity, FIGS. 1a and 1b are drawn with the waveguide axis running vertically. Also for purposes of clarity, the remainder of the chip in which the waveguide is formed has been omitted from FIG. 1a.

The SLD should have a waveguide channel or cavity 10 which should be of the form of a parallelogram in plan view. The parallelogram 12 is defined as lying between facets 14 and 16 which form terminations of the waveguide within the chip. The length of the parallelogram and the angle of the facets is preferably related such that a line 18 drawn perpendicular to a facet at any point thereon will not intersect the opposite facet and all internal reflections will be made to leave the SLD by traversing only a short length of the pumped area of the SLD, as shown by arrows 20. Output light 22 transmitted by the facet will exit the SLD at an angle determined by the angle of the facet and the relative refractive indices of the SLD waveguide material and the medium on the outside of the facet. The axis of the cavity is thus inclined to the facet surfaces 14 and 16 to achieve the geometry described above. Radiation which is reflected out of the cavity by facet mirrors 14, 16 is rapidly absorbed in the surrounding semiconductor material of the chip. Further discussion of the angle of inclination between the facets and the waveguide axis may be found in Alphonse et al, U.S. Pat. No. 4,821,277, and Figueroa et al, U.S. Pat. No. 4,856,014, both incorporated by reference above.

The SLD according to the invention, itself, may be formed in many ways as long as a quantum well is formed in the active region of the layered structure of the SLD, as will be discussed below with reference to FIGS. 3 and 4. For convenience, the structure illustrated in FIG. 1a corresponds to a so-called inclined stripe structure in which a stripe, such as gap 24 is formed in or on a layer of semiconductor material, preferably by deposition or etching, to form a waveguide defining the axis of the cavity of the SLD. The actual cavity or waveguide will be only slightly wider than the stripe itself due to carrier diffusion into the material of the chip. The stripe 24 may be formed as a gap in an insulator or other structure defining the boundary of a contact to the layered semiconductor structure and therefore defines the pumped region of the device. Gain is lost at the edge of the stripe or pumped region in gain guided structures and the index of refraction changes abruptly at the edge of the stripe in index guided structures, thus establishing the boundary of the waveguide or cavity to provide confinement of photons of a common wavefront of uniform phase in the lateral direction (i.e. parallel to the plane of the active region and perpendicular to the cavity axis). In either gain guided or index guided devices, photon confinement in the vertical direction is provided by a change of index of refraction provided by a vertical change in alloying material within the cavity.

Referring now to FIG. 2, the structure of an SLD having a known double-heterojunction will now be described for purposes of comparison with the quantum well SLD structure in accordance with the present invention. Layer 32 is a metallization layer forming one of the electrical contacts of the device. This metallization layer should be applied after the formation of the layered semiconductor portion of the SLD. The first semiconductor layer 34 is usually provided as a substrate of n-type gallium arsenide (GaAs). Inactive cladding layer 38, usually of n-type aluminum gallium arsenide (AlGaAs) is typically grown by liquid phase epitaxy (LPE). Formation of cladding layer 38 is followed by an active region 40 which is usually of undoped GaAs. Another cladding layer 42 of p-type AlGaAs (i.e. opposite to the conductivity type of layer 38) and a contact layer 41 of n-type GaAs are provided over the cladding layer 42. Stripe 24 is formed by etching, abrading, or otherwise removing a portion of insulating silicon dioxide layer 44 over an elongated area as shown in FIG. 1 to form a current confinement structure and delimiting the area over which electrons and holes are injected into the active layer 40. Metallization layer 50 is formed over the insulating layer 44, stripe 24 and the cladding layer 42 exposed by stripe 24. Exemplary compositions of these layers are taught is Figueroa et al, U.S. Pat. No. 4,856,014, cited above, which has been fully incorporated by reference above, but are not critical to the practice of the invention. As disclosed therein, each layer is preferably formed by liquid phase epitaxy but this technique is similarly not critical to the practice of the invention.

It is also to be understood that while a material system employing AlGaAs, as described above, is considered to be preferable, alternative material systems such as indium phosphide (InP/InGaAsP) and other Group III-V semiconducting compounds may be employed with the invention as long as two basic conditions are observed. Specifically, the epitaxial materials must be nominally lattice matched to their substrates, as is inherent in the GaAs/AlGaAs system, and the emitting composition must have a band-gap which corresponds to the wavelength produced by the Group III-V compound chosen. For example, for InP/InGaAsP the band-gap should correspond to an emitted light wavelength is between 1000 and 1700 nanometers.

The difference in doping between the cladding layers 38 and 42 and the active region 40 forms a junction in the same manner as in double-heterojunction lasers. During deposition of the successive layers, some diffusion of impurities from the oppositely doped cladding layers 38 and 42 into active layer 40 takes place. This diffusion effectively forms a p-n junction somewhere within the active layer 40.

The band-gap energy profile for this structure is shown in substantially magnified form by line 64 at the right-hand side of FIG. 2 and is characteristic of both gain guided and index guided devices. The band gap energy is the difference between the energy of the conduction band and the energy of the valence band. Width d' of the band-gap energy profile in region 62 will correspond to the thickness of the active region.

In contrast, FIG. 3 shows a cross-section of a quantum well SLD structure in accordance with the invention. For simplicity of discussion, and to more aptly contrast the features of the invention with the structure of FIG. 2, FIG. 3 is, more particularly, a gain guided structure defining the pumped region by stripe 24. Other structure common to both FIG. 2 and FIG. 3 is identified by like reference numerals and will not be discussed further in regard to FIG. 3.

Specifically, the invention provides uniformly doped cladding layers 38 and 42, of opposite polarity. Between cladding layers 38, 42, are provided a graded n-type AlGaAs layer 70, a graded p-type AlGaAs layer 74 and an undoped, extremely thin active layer 72, preferably of $Al_xGa_{1-x}As$, where $0 \leq x \leq 0.3$. These layers produce the band-gap energy profile shown (more greatly magnified than in FIG. 2) at the right-hand side of FIG. 3. This band-gap energy profile is referred to as a separate confinement heterojunction and dimension d, corresponding to the thickness of the active layer 72, is on the order of the carrier deBroglie wavelength, forming a quantum well. The graded composition (i.e. with the change of mole fraction of alloying material) over the thickness of the layers 70 and 74, results in a band-gap energy profile according to one of profiles 54, 56 and 58. A generally parabolic profile such as 54 or 56 is preferred but linear profile 58 is completely adequate for the practice of the invention and is much more easily achieved. These three profiles are referred to as a Graded Index Separate Confinement Heterostructure (GRINSCH).

GRINSCH structures have also been used surrounding the active region of double-heterojunction lasers such as in Hayakawa et al., U.S. Pat. No. 4,841,533, but it is to be noted that such layers are generally much thicker than layers 70, 74 of the present invention and are done for the optical properties of the alloy rather than for the electrical properties, as in the present invention.

Profile 52, by way of contrast, would result if layers 70 and 74 were not graded and would be referred to simply as a Separate Confinement Heterostructure with which the invention would be operable. However, the graded alloy composition of layers 70, 74 provides one of the band-gap energy profiles 54, 56, 58 which reduces the energy at which the electron-hole pairs can be transferred to the quantum well and are therefore preferred to profile 52.

Liquid phase epitaxy cannot be used to form layers 70, 72 and 74 because of the varying composition of layers 70 and 74 and the thinness of active layer 72, in particular. Layers 70, 72 and 74 are preferably formed by any form of vapor phase epitaxy or molecular beam epitaxy. The alloy composition of layers 70 and 74 is also adjusted as the layers are formed so that the potential gradient profile at any point within the thickness of the inactive cladding layers will assist in the transfer of electrons and holes to the potential well formed by the thinness of the active region 40.

It is significant that the thickness d' of the active region of the double-heterostructure, shown by lines 62, is substantially greater than dimension d of the present invention, regardless of whether graded energy band-gap profiles are established in the cladding layers of FIG. 2. This thickness d' does not allow the formation of a quantum well in which the density of states of electrons and holes will be quantized at levels at which recombination will be enhanced. In comparison, the thickness corresponding to such a quantum well is shown at d of FIG. 3.

It is to be understood in this regard that when a GRINSCH structure with a graded index of refraction is employed in double-heterojunction semiconductor lasers, it is desirable to limit the thickness of the active region due to the optical properties of a GRINSCH structure as discussed in *A Graded-Index Waveguide Separate-Confinement Laser with Very Low Threshold and a Narrow Gaussian Beam*, by W. T. Tsang; Applied Physics Letters 39(2), Jul. 15, 1981, pp. 134–137, which is also incorporated herein by reference. In contrast, according to the present invention, the thickness of the active region is further reduced to form a quantum well in order to alter the electrical properties of the structure by enhancing the efficiency of recombination of electrons and holes throughout the active region. While some reduction in threshold current will be noted as double-heterostructure active regions are made thinner, an increase in threshold by a factor of two to three will invariably occur when double-heterostructure laser structures are modified to form SLDs due to the loss of gain when internal optical feedback is substantially eliminated.

As noted above, gain guided structures are subject to variation in performance with temperature, particularly in terms of stability of the direction and distribution profile of the output light. Accordingly, the use of an index guided structure, which will now be described with reference to FIG. 4, is preferred when only performance is considered. However, it is to be understood that gain guided structures may be preferable in some applications where directivity and distribution of the output light is not critical or variations therein may be accommodated by an external optical system, such as a condensing or collimating lens and, therefore, ease and economy of manufacture become predominant motivating factors in choice of design.

Figure 4:
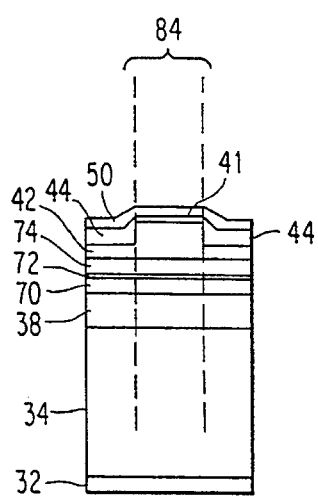
FIG. 4 is a cross-sectional view of an index guided embodiment of the invention employing a ridge wave guide.

Referring now to FIG. 4, a preferred, generic, index guided embodiment of the invention including a ridge wave guide will be described. Layers which are common to the gain-guided structure are similarly numbered and will not be described further. Specifically, a current confinement gap is formed in insulator layer 44 as before. Cladding layer 42 is initially formed as a thick layer and covered with a contact layer 41 in order to form a reliable electrical contact to the surface of layer 42, which would otherwise develop an oxide on its surface. Layers 41 and 42 are then etched, preferably by using a mask at the location of the ridge, until the thickness of layer 42 is significantly reduced other than at the location 84 of the ridge waveguide. An insulating layer, such as an oxide is then applied to the areas other than the ridge (i.e. to the entire surface, after which the insulating layer is removed above the remaining portion of layer 41. Finally, a metallization layer 50 is applied to complete the device. This ridge waveguide is similar to the laser waveguide disclosed in *High Power Ridge-Waveguide AlGaAs GRIN-SCH Laser Diode* by C. Harder et al., Electronics Letters, pp. 1081–1082, Sep. 25, 1986, which is hereby fully incorporated by reference, and the ridge waveguide according to the invention can be formed of plural layers of material doped at different impurity concentrations as described therein.

It should be noted in this preferred, index-guided, embodiment of the invention, that the current is also confined by the gap in insulator layer 44 as in the gain-guided embodiment described above. However, in addition to the limitation of the pumped region by limiting the area contacted by electrode 50, a large change in refractive index occurs at the lateral interface between the ridge formed in cladding layer 42 and insulator 44. This additional guiding of photons in the waveguide provides increases light directivity and distribution and reduction of changes therein with temperature in comparison with gain-guided devices.

In accordance with the present invention, the gain attributable to increased recombination efficiency due to the quantum well is much larger in comparison to the gain due to positive photon feedback. Therefore, the difference in threshold current in SLDs including a quantum well and comparable quantum well semiconductor laser structures is very much smaller. Since quantum well laser structures exhibit a smaller current threshold than double-heterojunction semiconductor lasers, the threshold current of a quantum well SLD, according to the present invention will be comparable to that of conventional double-heterojunction lasers. Therefore, a SLD in accordance with the present invention provides a solution to the problem of reduction of noise due to optical feedback and Fabry-Perot modulation with little or no penalty or requirement of an engineering trade-off in regard to driving circuits, power supplies and cooling arrangements.

Gain or loss for a semiconductor light source cavity is a function of cavity length. Well-understood current threshold relationships which apply to laser diode designs also apply to SLDs. However, assumptions which are generally made in regard to laser diodes differ significantly between these types of devices and allow some insight into the particular benefits of the quantum well SLD in accordance with the invention.

The current threshold for a device is defined as the point at which the gain of the device becomes equal to the sum of losses of the device throughout the cavity. The equations for losses in terms of current density proposed in *Ultralow-Threshold Graded-Index Separate Confinement Single Quantum Well Heterostructure (AlGa)As Lasers With High Reflectivity Coatings* By Pamela L. Derry et al., Appl. Phys. Lett. 50, pp. 1773–1775 are generally considered definitive at this time. Threshold current for a particular device can be deduced by multiplying each term in the equations proposed by Derry by the area of the pumped region.

Following the equations proposed by Derry et al, the current threshold of a double-heterojunction laser is:

$$I_{th}^{DH} = 800XY + 19XY + \frac{\alpha_{DH}^\omega XY}{0.4} + \frac{Y}{0.8} \ln \frac{1}{R_1 R_2}$$

where X and Y are the length and width of the pumped region, respectively. The first term, 800XY, on the right side of the equation is called the transparent current loss which is a bulk loss caused by the absorption of carriers (i.e. the non-radiative recombination of carriers). The second term is called the active region loss. The third term is the waveguide or mode scattering loss in which the denominator is the differential gain coefficient and $\alpha$ is a collective term for losses due to waveguide imperfections. The fourth term is the reflectivity loss. The denominator of the coefficient of the fourth term is twice the differential gain coefficient.

The threshold current for quantum well lasers is similar:

$$I_{th}^{QW} = 50XY + \frac{\alpha_{QW}^\omega XY}{0.7} + \frac{Y}{1.4} \ln \frac{1}{R_1 R_2}$$

In this case, there is no term for the active region loss due to the narrowness (i.e. thinness) of the quantum well and the transparent current loss is much lower. More importantly, the differential gain coefficient is approximately twice that for the double-heterojunction structure.

Since waveguide losses are generally low in lasers, $\alpha$ approaches 0 and the waveguide loss term is often omitted from this computation, as it is in *Scaling Laws and Minimum Threshold Currents for Quantum-Confined Semiconductor Lasers*, by Amnon Yariv, Appl. Phys. Lett. 53, pp.1033–1035, September, 1986. Further, since $\alpha$ is a collective term expressing losses from waveguide imperfections, $\alpha$ would be expected to be the same in both double-heterojunction structures and quantum well structures when the waveguides themselves are similar.

Figure 5:
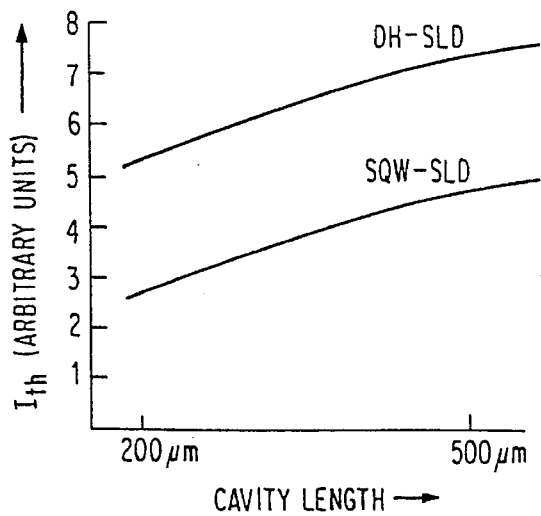
FIG. 5 is a graph of the computed current threshold behavior of double heterojunction SLDs and quantum well SLDs according to the invention when waveguide losses are neglected.

If the waveguide loss term is omitted, the threshold current is shown in FIG. 5 for fairly common cavity lengths. As can be seen, the current threshold varies slightly as a function of cavity length for both the double-heterojunction SLD and a quantum well SLD in accordance with the invention. For any particular cavity length, the current threshold of a quantum well SLD is about half that of the double-heterojunction SLD.

Figure 6:
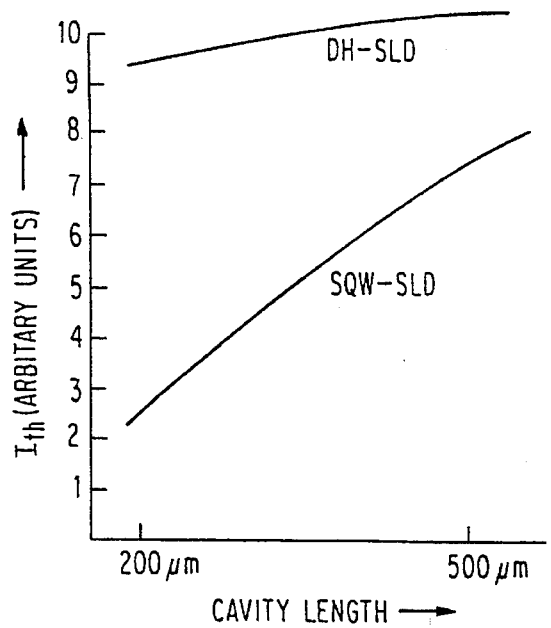
FIG. 6 is a graph of the computed current threshold behavior of double heterojunction SLDs and quantum well SLDs according to the invention when waveguide losses are included.

However, it has been found by the inventor herein that the structures forming an atypical waveguide, such as the inclined stripe of an SLD, represents a significant waveguide imperfection which forces $\alpha$ to become significant and which cannot then be ignored. Even when waveguide losses are considered in double-heterojunction devices, the waveguide losses are still relatively small in comparison with the transparent current loss. However, since the transparent current losses of a quantum well device are less than $\frac{1}{16}$ that of the double-heterojunction bulk losses, the inventor herein has recognized that the waveguide loss dominates the effects of other losses. Therefore, when $\alpha$ is significant, the current threshold will be generally inversely proportional to the differential gain coefficient which, as noted above, for quantum well SLDs, according to the invention, is approximately twice that of double-heterojunction SLDs. Hence, the current threshold will be almost directly proportional to the cavity length over cavity lengths of interest in quantum well SLDs according to the invention, as shown in FIG. 6. This fact effectively allows the threshold current to be reduced almost at will by the designer as long as a sufficient cavity length is provided to generate the desired light intensity level. Since the relationship between cavity length and threshold currents is nearly linear over cavity lengths of interest, the relationship can be quantitatively determined empirically with a very few devices of differing cavity lengths. Thereafter, a cavity length can be established in the design which will determine, and thus establish, the threshold current of the device when manufactured.

Accordingly, it is seen that the provision of a quantum well in any SLD device provides a way of reducing the threshold current as well as reducing the temperature coefficient of the SLDs. Therefore, the invention provides a highly efficient light source which can be modulated with a communication signal in the gigahertz range with low noise and Fabry-Perot modulation and high reliability over a substantial temperature range even when providing a light signal output into optical fiber light guides which may exhibit high levels of Rayleigh backscattering or internal reflections from connection surfaces or other imperfections therein. Similarly, the need for temperature compensated driving circuits and expensive and complex cooling arrangements is very much reduced in comparison with SLDs previously available in the art.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of making a superluminescent diode including steps of:
   forming an active layer having a thickness on an order of a carrier deBroglie wavelength;
   forming a quantum well in said active layer;
   forming a waveguide adjacent said active layer, said waveguide being formed to have ends and an axis; and
   forming termination means at said ends of said waveguide, wherein said termination means are inclined with respect to said axis.

2. A method as recited in claim 1, further comprising a step of forming said active layer of $Al_xGa_{1-x}As$, where $0 \leq x \leq 0.3$.

3. A method as recited in claim 1, further comprising a step of forming said active layer of indium gallium arsenide phosphide.

4. A method as recited in claim 1, further comprising steps of:
   forming a first cladding layer adjacent said active layer;
   forming a second cladding layer adjacent said active layer opposite said first cladding layer.

5. A method of making a superluminescent diode including steps of:
   forming a first cladding layer;
   forming a quantum well in an active region having a thickness on an order of a carrier deBroglie wavelength, said active region being formed adjacent said first cladding layer;
   forming a second cladding layer adjacent said active region; and
   forming a plurality of graded layers adjacent said active region, wherein said graded layers each include a graded index of refraction, a first graded layer of said graded layers being formed between said active region and said first cladding layer and a second graded layer of said graded layers being formed between said active region and said second cladding layer.

6. A method as recited in claim 5 wherein said first and second cladding layers are formed by any vapor phase epitaxy or molecular beam epitaxy technique.

7. A method as recited in claim 6 in which said step of forming said first cladding layer and said step of forming said second cladding layer each include the further step of altering the mole fraction of an alloying material as each of the first and second cladding layers are formed.

8. A method as recited in claim 5 including the further step of forming a ridge from one of said cladding layers.

9. A method as recited in claim 7 including the further step of forming a ridge from one of said cladding layers.

10. A method as recited in claim 5, further comprising a step of forming said active region of $Al_xGa_{1-x}As$, where $0 \leq x \leq 0.3$.

11. A method as recited in claim 5, further comprising a step of forming said active region of indium gallium arsenide phosphide.

12. A method as recited in claim 5, wherein said graded index of refraction is approximately linear.

13. A method as recited in claim 5, wherein said graded index of refraction is approximately parabolic.

14. A method as recited in claim 5, further comprising steps of:
   forming a waveguide adjacent said active region, said waveguide being formed to have ends and an axis;
   forming termination means at said ends of said waveguide, wherein said termination means are formed to be inclined with respect to said axis.

15. A method as recited in claim 14, wherein said termination means are mutually positioned such that no line perpendicular to a first termination means of said termination means and intersecting any point on said first termination means intersects any point on others of said termination means.

16. A method as recited in claim 8, wherein said step of forming a ridge includes steps of:
   removing portions of said second cladding layer to form a plurality of side cladding layers and a central cladding layer, such that said central cladding layer has a thickness greater than that of said side cladding layers;
   forming an insulator layer adjacent said second cladding layer;
   removing a central portion of said insulator layer adjacent said central cladding layer.

17. A method as recited in claim 16, wherein said central cladding layer is formed to have a length and said quantum well is formed to have said length.

* * * * *